US012695434B1

(12) United States Patent
Tsironis

(10) Patent No.: US 12,695,434 B1
(45) Date of Patent: Jul. 28, 2026

(54) LOAD PULL SYSTEM USING TUNER WITH TWO DUAL-STATE TUNING PROBES

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 357 days.

(21) Appl. No.: 18/368,668

(22) Filed: Sep. 15, 2023

(51) Int. Cl.
*H03H 7/38* (2006.01)
*G01R 27/28* (2006.01)

(52) U.S. Cl.
CPC .............. *H03H 7/38* (2013.01); *G01R 27/28* (2013.01)

(58) Field of Classification Search
CPC ....... G01R 27/32; G01R 31/2822; G01R 1/26
See application file for complete search history.

(56) References Cited

U.S. PATENT DOCUMENTS

| | | | |
|---|---|---|---|
| 6,674,293 B1 | 1/2004 | Tsironis | |
| 7,646,268 B1 * | 1/2010 | Tsironis | H01P 5/04 |
| | | | 333/263 |
| 9,041,498 B1 * | 5/2015 | Tsironis | H03H 7/40 |
| | | | 333/263 |
| 9,257,963 B1 | 2/2016 | Tsironis | |
| 9,625,556 B1 | 4/2017 | Tsironis | |
| 9,666,928 B1 | 5/2017 | Tsironis | |
| 10,177,428 B1 * | 1/2019 | Tsironis | H01P 1/222 |
| 10,177,429 B1 * | 1/2019 | Tsironis | H01P 5/04 |
| 11,428,771 B1 * | 8/2022 | Tsironis | H01P 5/04 |
| 2003/0122633 A1 * | 7/2003 | Tsironis | H01P 5/04 |
| | | | 333/33 |

OTHER PUBLICATIONS

"Load Pull Measurements" [online], Wikipedia [retrieved on Nov. 18, 2016] Retrieved from Internet <URL:http://en.wikipedia.org/wiki/Load_ pull>.
"Computer Controlled Microwave Tuner—CCMT", Product Note 41, Focus Microwaves Inc., Jan. 1998.
Linear Actuator [online], Wikipedia [retrieved on Apr. 25, 2020]. Retrieved from Internet <URL: https://en.wikipedia.org/wiki/Linear_ actuator>.
"Lecture 20: Transmission (ABCD) Matrix" [online], EE 481/581— Microwave Engineering, Course Syllabus [retrieved on Jul. 13, 2015] Retrieved from Internet <URL: https://whites.sdsmt.edu/classes/ee481/notes/481Lecture20>.
"Regula falsi" [online], Wikipedia [retrieved on Aug. 26, 2021]. Retrieved from Internet URL: https://en.wikipedia.org/wiki/Regula_ falsi>.

* cited by examiner

*Primary Examiner* — Giovanni Astacio-Oquendo
*Assistant Examiner* — Temilade S Rhodes-Vivour

(57) ABSTRACT

A load-pull measurement system uses a PC control computer, interface, calibration method and at least one slide screw impedance tuner with two dual-tuning probes; the tuner probes share the same slabline; they are inserted diametrically at fixed depth (distance from the center conductor) from both sides into the channel and move only horizontally along the slabline. The tuner does not have cumbersome adjustable vertical axes controlling the penetration of the probes and its low profile is optimized for on-wafer operations. The carriages holding the probes are moved at high speed along the slabline using linear electric actuators. An efficient de-embedding calibration method serves speeding up additionally the measurement procedure.

5 Claims, 12 Drawing Sheets

FIG. 3: Partly Prior art $S21=S12=T_i$ $S11=R_i$          $C_i$          $S22=R_i$

TEST PORT $T1$          $T2$          IDLE PORT $<a>$          $e^{-j\beta L1}$          $e^{-j\beta L2}$          $Zo$ $\Gamma=b/a$          $\approx 0$          $R1$          $R1$          $R2$          $R2$ LOOP2          $<b>$          $e^{-j\beta L1}$          $e^{-j\beta L2}$

LOOP1          LOOP3          $T1$          $T2$

REVOLVING LOOP 3          PROBE 2

PROBE 1

LOAD PULL SYSTEM USING TUNER WITH TWO DUAL-STATE TUNING PROBES

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL: http://en.wikipedia.org/wiki/Load_pull>
2. "Computer Controlled Microwave Tuner—CCMT", Product Note 41, Focus Microwaves January 1998.
3. Tsironis C., U.S. Pat. No. 6,674,293, "Adaptable Pre-Matched Tuner System and Method".
4. Tsironis C., U.S. Pat. No. 9,625,556, "Method for Calibration and Tuning with Impedance Tuners".
5. Tsironis C., U.S. Pat. No. 9,666,928, "High power slide screw tuners", FIG. 7.
6. "Linear Actuator" [online], Wikipedia [retrieved on Apr. 25, 2020] Retrieved from Internet <URL: https://en.wikipedia.org/wiki/Linear_actuator>
7. Tsironis C., U.S. Pat. No. 9,257,963, "Impedance Tuners with Rotating Probes", FIG. 15.
8. "Lecture 20: Transmission (ABCD) Matrix" [online], EE 481/581-Microwave Engineering, Course Syllabus [retrieved on Jul. 13, 2015] Retrieved from Internet <URL: http://whites.sdsmt.edu/classes/ee481/notes/481Lecture20>.
9. "Regula falsi" [online], Wikipedia [retrieved on Aug. 26, 2021]. Retrieved from Internet <URL: https://en.wikipedia.org/wiki/Regula_falsi>

BACKGROUND OF THE INVENTION

This invention relates to RF load and source pull testing of medium and high-power RF transistors and amplifiers using remote controlled electro-mechanical impedance tuners.

A popular method for testing and characterizing microwave transistors in their non-linear region of operation is "load pull" (see ref. 1). Load pull is a RF device measurement technique employing microwave impedance (load-pull) tuners and other microwave test equipment as shown in FIG. 1. The microwave tuners 2, 4 (see ref. 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which includes an electronic interface to communicate with the instruments 1, 5 and the tuners 2, 4 using digital control and communication cables 7, 8 and 9.

DESCRIPTION OF PRIOR ART

Impedance tuners include, in general, a low-loss transmission line 20 (slabline), FIG. 2, and a conductive tuning element (tuning probe, 21); the probe 21 has a concave bottom and is attached to a complex, adjustable high precision motor-controlled 25 vertical axis 22 and is inserted into the slabline 20, approaching and capacitively coupled to the center conductor 23, guided and moved 24 along the axis of the slabline; this movement of the tuning probes creates, in a certain frequency range, a controllable variable reactance (joC), allowing the synthesis of various impedances (or reflection factors) which are present at the test port 26, covering up to the quasi totality of the Smith chart (the polar impedance mapping display shown as normalized reflection factor, FIG. 3). The impedance synthesis follows a path 30, 31 between the origin (50Ω) and an arbitrary target-1. Inserting the tuning probe into the slabline creates path 30 and moving it along the slabline creates path 31. The relation between reflection factor Γ and impedance Z is given by Γ=(Z−Zo)/(Z+Zo), wherein Z=R+jX and wherein Zo is the characteristic impedance. A typical value used for Zo is 50Ω.

When parallelepiped metallic tuning probes (slugs) 21, FIG. 2, with a concave bottom, approach the center conductor 23, they capture and deform the electric field, which is mostly concentrated in the area sidewise between the center conductor 23 and the ground planes of the slabline 20. This field deformation allows creating the high and controllable reflection factors. The main disadvantage of this embodiment is the requirement of high precision and resolution and, by consequence, tall and cumbersome vertical probe movement mechanisms precise over the entire travel, since almost all useful reflection occurs when the probe is very close to the center conductor (see ref. 5). This movement process slows down the tuning procedure for two reasons: (a) when the probe is away from the center conductor, the vertical probe movement is lengthy and much less effective in terms of generating useful reflection factor, and (b), because the vertical moving resolution is constant and enhanced positioning accuracy and resolution are required all the way due to high tuning sensitivity in the high reflection area, when the probe is very close to the center conductor.

Related prior art (see ref. 3) does not teach impedance tuners with two fixed penetration tuning probes, thus requiring at least one high precision complex vertical axis to tune (FIG. 3). Neither relevant prior art ref. 3 or 4 teach a tuner calibration method for alternatively swapping and crossing over constant penetration tuning probes in a shared transmission slabline structure. This overlapping structure, though, is essential and compatible with the proposed low profile, compact size tuner and attractive, because of the new high speed adaptive de-embedding tuner calibration and operation (see ref. 4).

BRIEF SUMMARY OF THE INVENTION

The invention discloses a load pull measurement system using a new type simpler and faster slide screw tuner and associated calibration and impedance synthesis (tuning) software. The tuner configuration, different from prior art, uses horizontal-only high-speed movement techniques of the tuning probes and, beyond the obvious lengthy method of calibrating all possible permutations of tuner states, also a preferred fast, custom de-embedding calibration method. Once the tuner is properly calibrated, new impedance synthesis (tuning) methods are applied. A full calibration would require measuring, typically, 100×100=10,000 tuner states (impedance points), whereas the herein disclosed adaptive de-embedding calibration requires only 100+100=200 points (theoretically 50 times faster).

The impedance tuner itself uses a low loss parallel plate airline also called a slabline 40, 79 (FIGS. 4-7). The tuning probes are, depending on the elected embodiment, either slugs 60, 61 or discs 50, 51 and are mounted either on lifts 62, 63 or on axes 52 rotating them eccentrically (see ref. 7). In both cases the tuning probes have two states: inserted (engaged) 32, 33, state 1, to create vector 34, or withdrawn, state 2, creating no reflection. In the first case there is a medium size reflection (S11≈0.5–0.7) and in the second case the slabline is a thru line (S11≈0). This can be reached either by inserting or withdrawing the slug into or out of the slot of the slabline (FIG. 6), or by rotating the disc into or out of the slot (FIGS. 4, 5). In both cases the RF result is the same, only the control mechanisms differ. In both cases also the penetration of the probe wings 56 must not protrude beyond the mid line of the center conductor in a way to allow the probes to cross over without conflict. This condition applies to both, rotating and slug probes.

The carriages 53, 54 are controlled using high-speed electric linear stepper actuators (see ref. 6) thus eliminating additional control gear. Last, not least, the tuning mechanism, liberated from cumbersome and expensive high resolution vertical probe control and movement delays, benefits also from inherent lower tuning error sensitivity to mechanical vertical probe positioning tolerances close to $|\Gamma|\approx1$, i.e., when the tuning probe is within micrometers, very close to the center conductor.

BRIEF DESCRIPTION OF THE SEVERAL VIEWS OF THE DRAWINGS

The invention and its mode of operation will be more clearly understood from the following detailed description when read with the appended drawings in which:

FIG. 2A depicts a front view of the entire tuner; FIG. 2B depicts a cross section of the tuning probe entering the slabline slot.

FIG. 8A depicts the two-port describing a capacitive tuning probe; FIG. 8B depicts the overall signal flow graph.

DETAILED DESCRIPTION OF THE INVENTION

Figure 1:
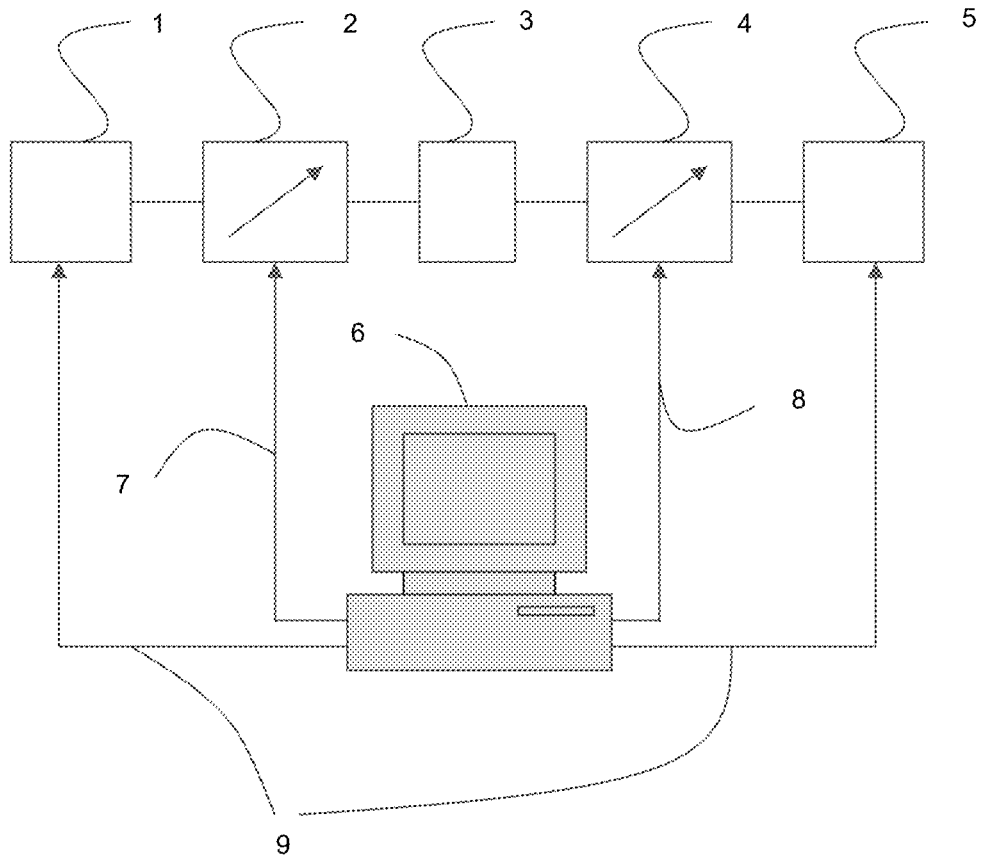
FIG. 1 depicts prior art, a typical automated load pull test system.
Figure 2:
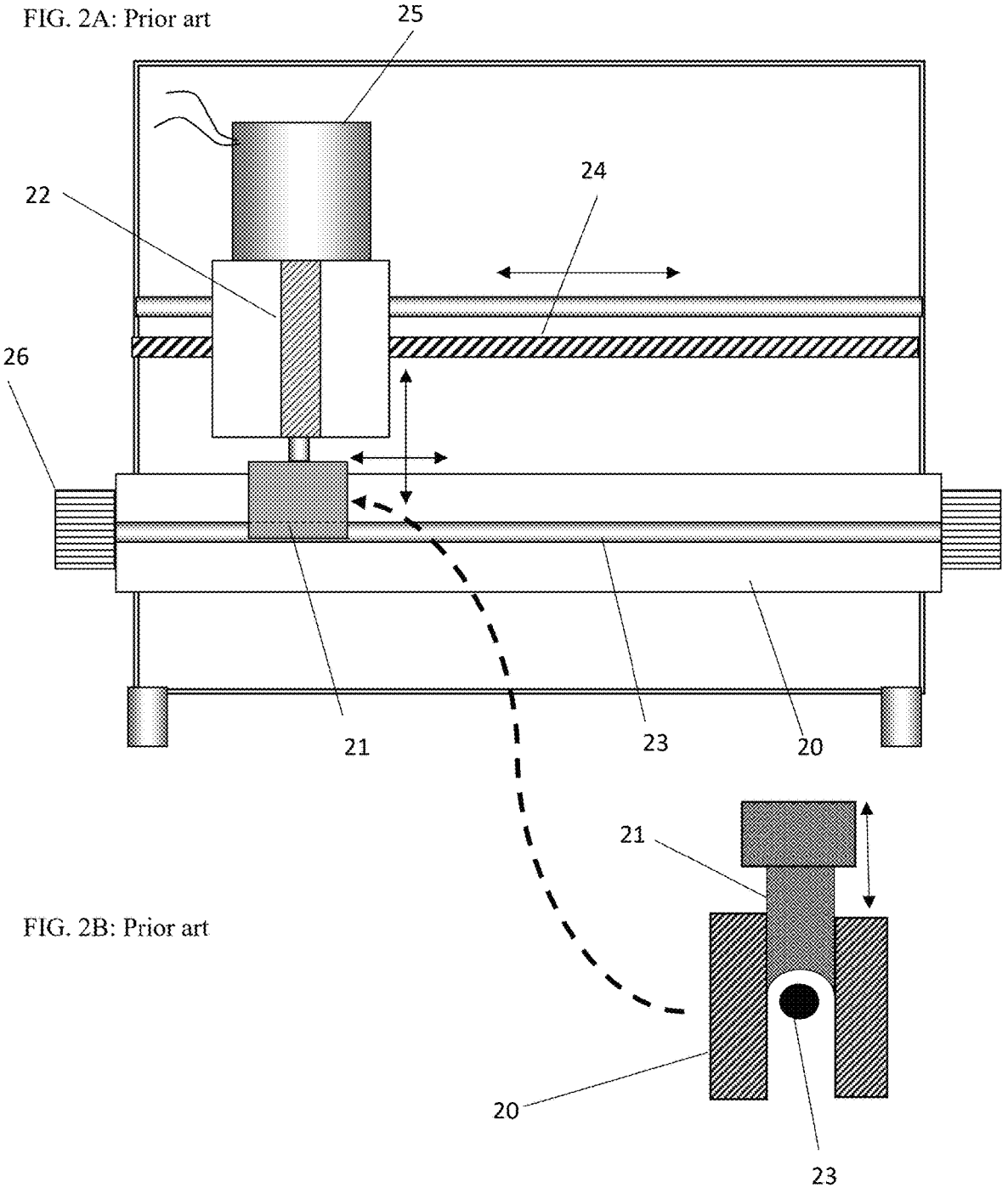
FIG. 2A through 2B depict prior art, a single probe impedance tuner.
Figure 3:
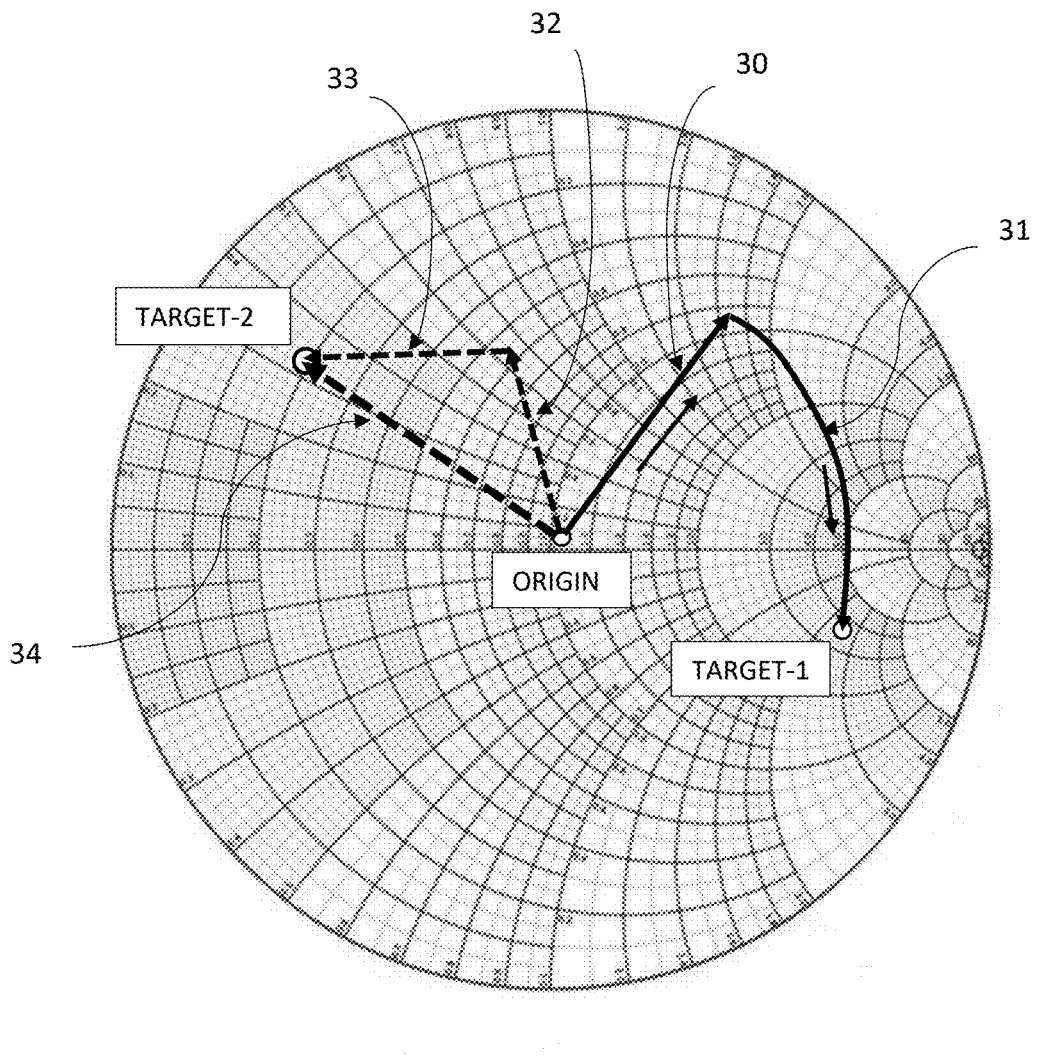
FIG. 3 depicts partly prior art, a Smith chart and two possible trajectories of impedance synthesis (tuning) to reach a target impedance starting from the origin of 50Ω. Reaching target-1 uses the prior art single-probe technique with vertical control; reaching target-2 uses the new two-probe technique without vertical control.
Figure 4:
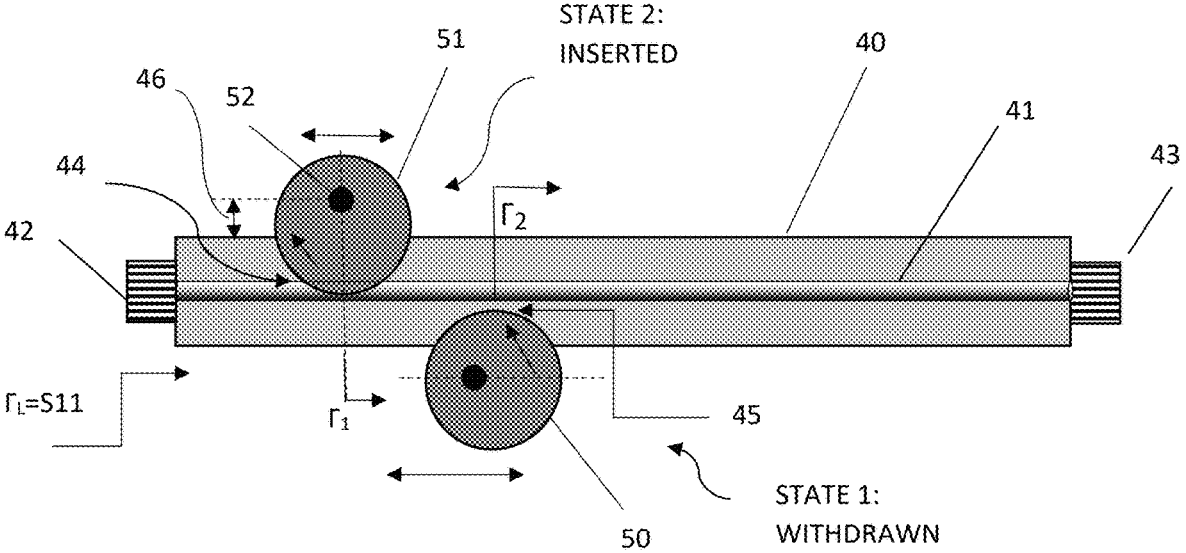
FIG. 4 depicts the concept of a shared-slabline two-state two, eccentrically rotating, disc-probe impedance tuner.
Figure 10:
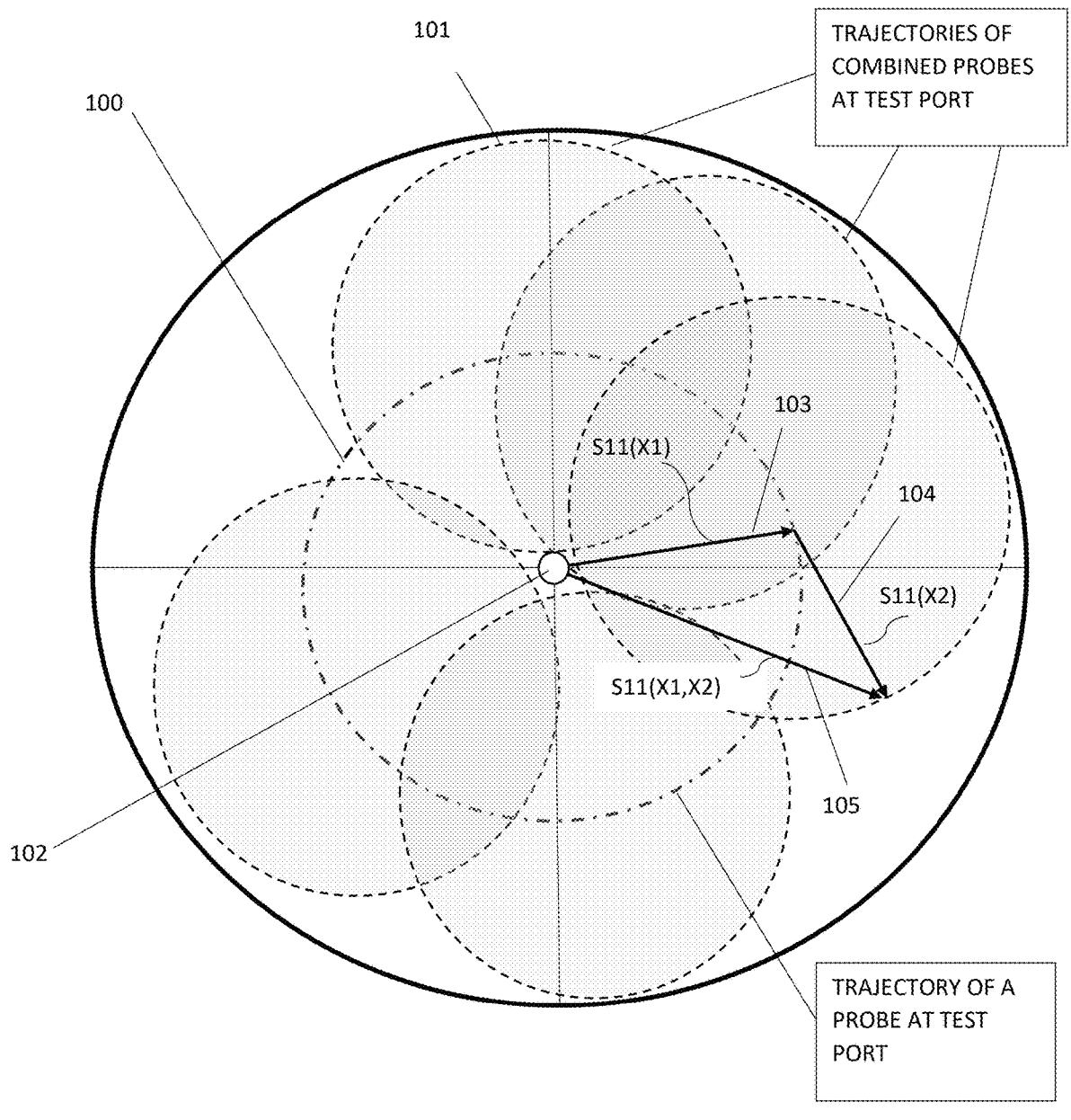
FIG. 10 depicts Smith chart coverage using two-probe impedance tuner with fixed probe insertion depth.

This invention discloses a radio frequency (RF, microwave), computer-controlled impedance tuning (load pull) system, suitable for load pull measurements, which includes at least one electro-mechanical impedance tuner, the calibration method of the tuner and an impedance synthesis (tuning) method. The tuner (FIG. 4 or 6) uses a low loss parallel plate transmission airline (slabline) 40, which includes two parallel conducting (metallic or metallized) sidewalls (FIG. 2B) forming a straight channel and a, typically but not exclusively, cylindrical or oval center conductor 41. The center conductor terminates at the two ends of the slabline, the test port 42 facing the DUT, and the idle port 43 facing the load. Two either parallelepiped 60, 61 or disc-shaped 50, 51 tuning probes are inserted opposite (diametral) to each-other from the top and the bottom (or from left and right if the slabline lies flat to save height) into the slabline channel and can be either inserted to a fixed depth 44 or withdrawn 45 and can be moved only horizontally along the slabline; each inserted probe creates at its own reference plane $\Gamma_1$ or $\Gamma_2$ concentric reflection factor circles 100 around the center 102 of the Smith chart (FIG. 10). The total reflection factor 101, viewed from the test port, is created by a planetary epicycloid superposition of the two reflection factor vectors (one circle rotates around a point at the periphery of the other) as can be seen in FIG. 10.

Figure 5:
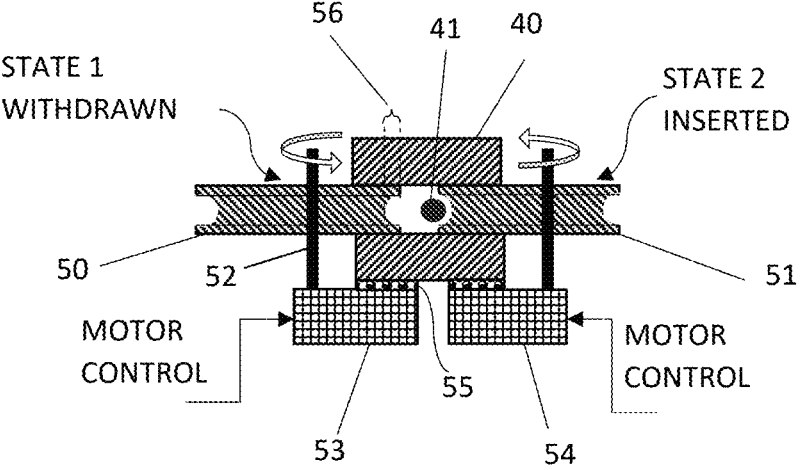
FIG. 5 depicts a detailed cross section of the impedance tuner of FIG. 4.

The two-probe with fixed vertical diametral probe penetration and only horizontal probe control concept can be implemented in a number of embodiments, either using disc-shaped tuning probes 50, 51 eccentrically rotating around their axis 52 (FIG. 4) or ordinary parallelepiped (slug) tuning probes (FIG. 6); the disc-probe embodiment employs the low loss slabline 40, in the channel of which penetrate 45, 46 the disc probes 50, 51 and couple capacitively with the center conductor 41; the two tuner states 2 (inserted) and 1 (withdrawn) are effectuated by rotating the discs between 0° (state 1) and 90-180° (state 2); no intermediate positions are considered. This rotation does not necessarily require along the slabline 40 sliding 55 stepper motors 53, 54, which control the rotational axes 52 of the disc-probes 50, 51, as shown in FIG. 5, to generate, even if this is a concrete possibility; it can be implemented using a remotely controlled relay that toggles the disc axis by roughly 90°.

Figure 6:
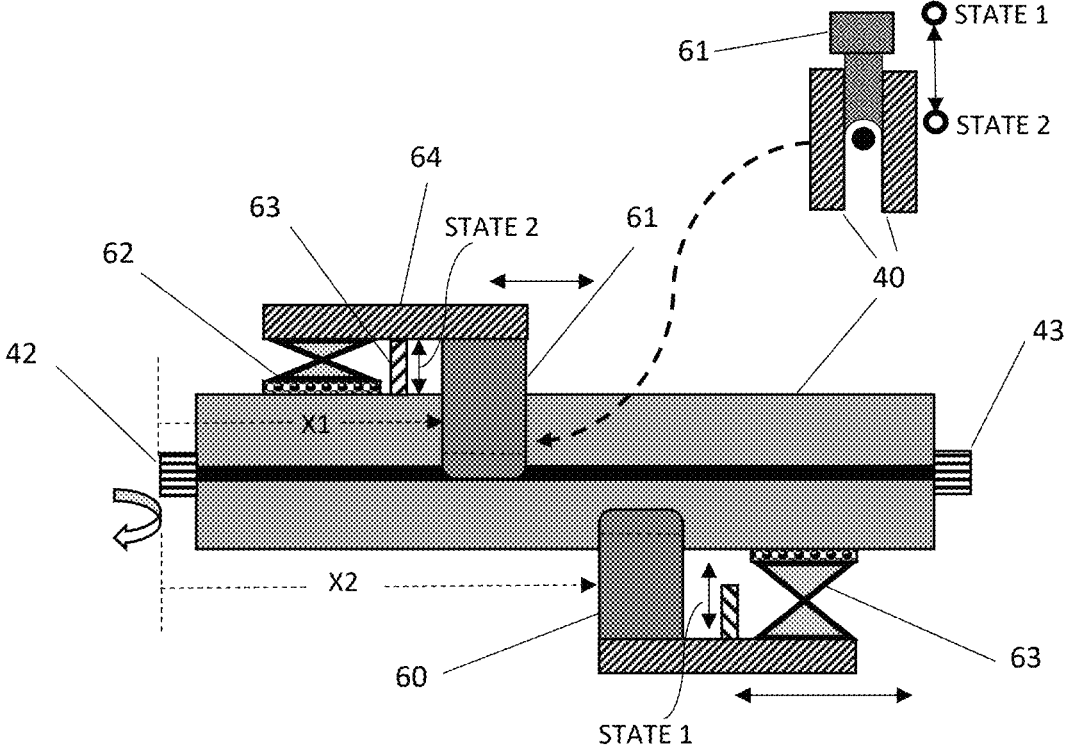
FIG. 6 depicts the concept of a shared-slabline two-state vertically moving block-shaped (slug) two-probe impedance tuner.

The alternative embodiment of the slug-shaped tuning probes 60, 61 is depicted in FIG. 6 in more detail: The slugs are held by a member 64 and moved vertically into the slabline 40 using lifts 62, 63. An, once adjustable, set screw 63 allows limiting the penetration to the maximum allowed level, set such as to allow the slugs to cross over without mechanical conflict. The probe positions X1 and X2 are referred to the tuner test port 42; if X1=X2, then both probes are at the same distance from the test port; if X1>X2 then probe 2 is closer to the test port; these quantities are relative. An operator can use offsets that shift the position of the probes; but it has to be clear which probe is closer to the test port. Here we use an offset of 0, which is theoretically useful but may in reality be impractical; in any case, the relative distance from the test port is the decisive factor; the idle port 43 is terminated with characteristic impedance Zo (50Ω).

Any reflection factor 105 is a function of the combined positions of the two probes X1 and X2: S11(X1,X2) and is the vector-sum of the reflection factors 103, 104 of both probes S11(X1) and S11(X2): assuming the X1-associated probe is closest to the test port, the total reflection factor S11(X1,X2) becomes:

$$S11(X1,X2)=S11(X1)+S12(X1)*S21(X1)*S11(X2)/(1-S22(X1)*S11(X2)),$$

wherein Sij(Xi) are s-parameters of the tuner section associated with the tuner probe at positions X1 and X2. During operation, as the probes move, so do the reference planes of these sections, and the tuning probes and sections may even swap. So, there is no practical way to handle this dynamic phenomenon, other than full tuner calibration for all possible permutations of the tuning probe positions X1 and X2; the horizontal control of the carriages in the slabline 79 is best accomplished using linear electric actuators (see ref. 6). These have a motorized body and their rotor axis is an extended horizontal ACME 24. Since the tuner does not have adjustable vertical axes, the required residual tuner zero matrix [S0] for a high-speed de-embedding calibration (see ref. 3), can only be created by withdrawing 45 the probes in STATE 1.

Figure 7:
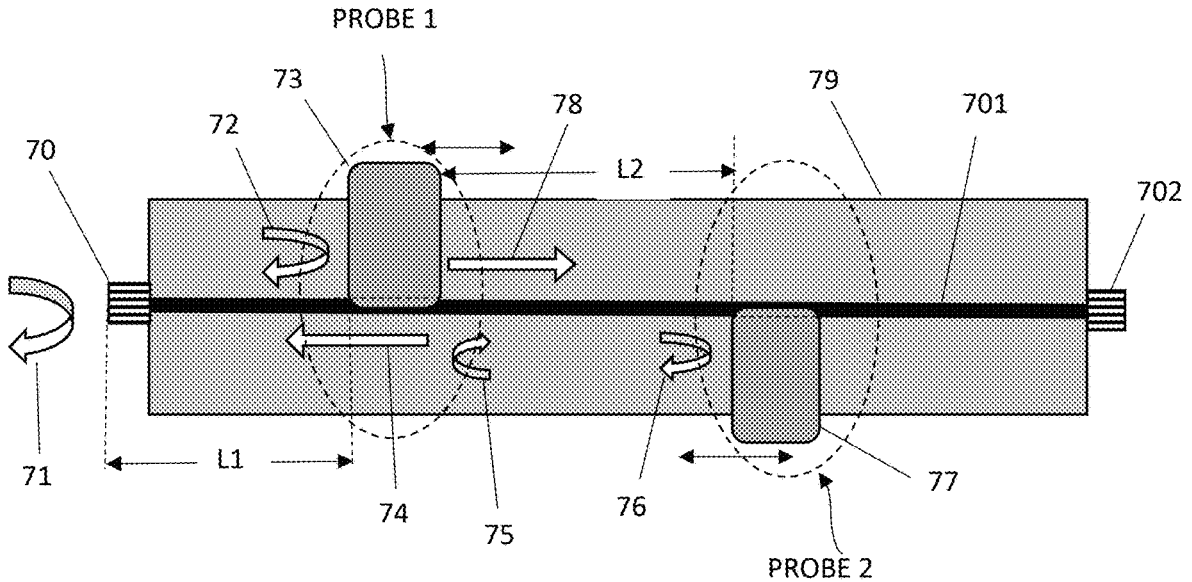
FIG. 7 depicts signal flow and multiple reflections created by the two probes of a two-probe impedance tuner with shared slabline. The probes can swap positions with regard to the test port 70.

The full signal flow behavior of the two-probe tuner is shown in FIG. 7: Signal entering into the test port 70 travels on the center conductor 701 until probe 1, 73; this creates a reflection 72; the remaining signal portion 78 travels towards probe 2; there, a second reflection 76 sends a portion of the signal back to probe 1 and the test port. What portion bypasses probe 2 towards the idle port 702 is absorbed by the load and does not return and is, therefore, ignored. The signal 76 reflected at probe 2, 77, returns and is reflected 75 again at probe 1 with a portion 74 escaping towards the test port. The total reflection 71, therefore, includes the primary reflection 72 and a number of secondary reflections 74 coming from probe 2 and the back-and-forth 75, 75 bouncing of signal power between probes 1 and 2. This multiple reflection phenomenon is described by the revolving LOOP 3 in FIG. 8 and resumes in an infinite, but rapidly converging, series of reflected signal power vectors generating the overall reflection vector 74. The transmission between the test port 70, probe 1, 73 and probe 2, 77 is described by lossless transmission lines having a phase $-2\pi L/\lambda$, where $\lambda$ is the wavelength $2=300$ mm/Frequency (GHz).

Figures 8A, 8B:
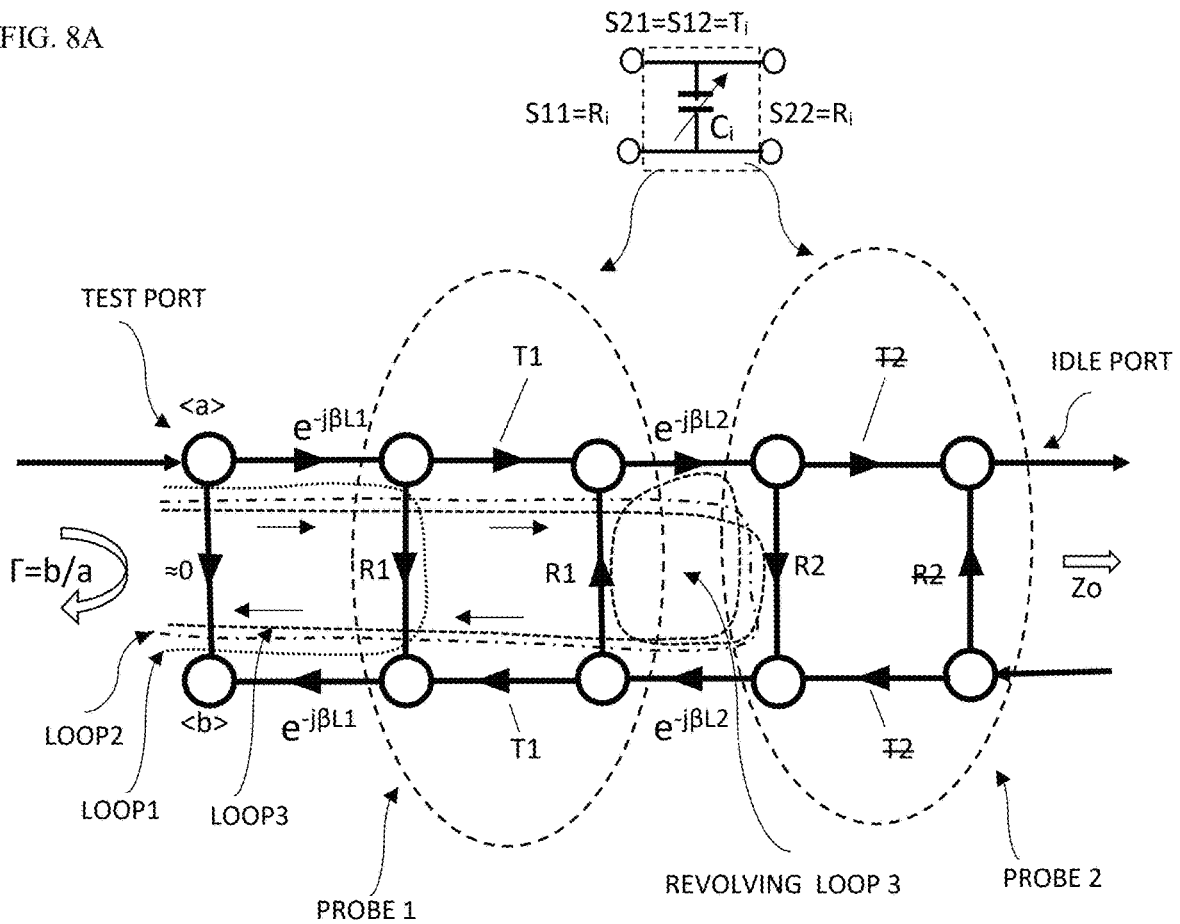
FIG. 8A through 8B depict the signal flow graph (SFG) of the two-probe impedance tuner.

FIG. 8B shows the signal flow graph describing the tuner, which is also shown schematically in FIG. 6: Each pair of nodes represent a port and each branch the complex signal flow factor S11&S22 or S21&S12 between the ports; each tuning probe (FIG. 8A) is described by a two-port having a reflection factor R (S11=S22) and a transmission factor T (S21=S12): probe 1 generates R1 and T1, probe 2 generates R2 and T2. The injected signal <a> returns as <b> after following several loops: between each probe there is a delay $\exp(-j\beta L)$; loop 1 represents the primary reflection, loop 2 the secondary reflection and loop 3 the multiple reflections; it must be remarked that loop 3 is revolving (repeating) adding each time a decreasing amount to the total reflection 71; loop 3 resumes in an infinite, but rapidly converging, series of reflected signal power vectors generating the overall reflection vector 71. The transmission factors T1 and T2 represent the portion of signal traversing the tuning probe, whereas the reflection factors R1 and R2 represent the reflected portion. Transmission lines are described by simple phase delays $\beta=2\pi/\lambda$. Assuming the probes represent capacitors C1 and C2 then we can approximate: $R1=-j\omega C1 Zo/(2+j\omega C1 Zo)$; $R2=-j\omega C2 Zo/(2+j\omega C1 Zo)$; $T1=2/(j\omega C1 Zo)$ and $T2=2/(2+j\omega C2 Zo)$. The section after probe 2 is matched to 50Ω, therefore signal is not returning and the associated R2 and T2 are ignored. By generating the signal loops 1, 2, 3, . . . which contribute to the overall reflected signal <b> we obtain for the reflection factor at the test port: $S11=<b>/<a>\approx\{e^{-j\beta L1}\cdot R1-e^{-j\beta(L1+L2)}\cdot R2\cdot T1^2-e^{-j\beta(L1+2L2)}\cdot T1^2 R2^2\cdot R1+ . . . \}$;

the series of loops is truncated, since the third loop (LOOP 3) is repeated n times with n=1, 2, 3, 4 . . . towards infinite, but its contribution to the total reflection factor at the test port is rapidly decreasing, since all s-parameters R (reflection) and T (transmission) and their products appearing at higher power $T1^{4n}$, $R1^{2n}$, $R2^{4n}$ etc. are smaller than 1 and rapidly vanishing, forming this way a converging infinite sum. The transmission between the test port 70, probe 1, 73 and probe 2, 77 is described by lossless transmission lines having a phase $-2\pi L/\lambda$.

Figure 11:
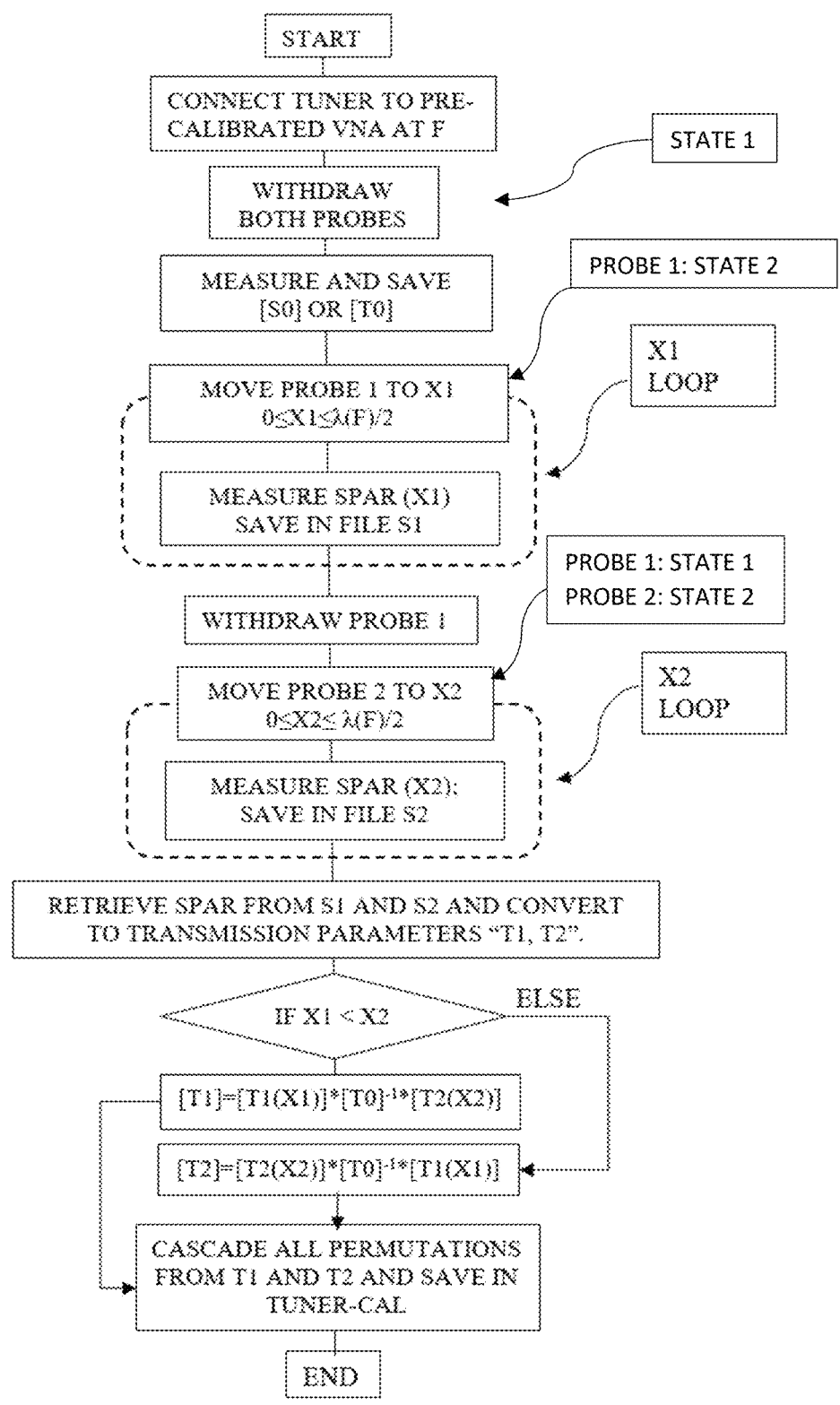
FIG. 11 depicts the flowchart of the de-embedding calibration algorithm of the shared-slabline 2-state (fixed-penetration) two-probe tuner.

The tuner calibration process at a given frequency F is possible using either of two methods: a first, traditional method and a second, fast de-embedding method; the first traditional method consists in measuring, on a pre-calibrated vector network analyzer (VNA) s-parameters between the test and idle ports for all N*M permutations of N*X1 and M*X2 tuning probe positions, with typical N~M values of at least 100, in order to generate a dense enough grid of calibrated points of at least 3.6° arc distance between points. In this case the total calibration of 10,000 points will last an average of 5.5 hours (assuming 2 seconds per point, including probe movement and data collection and saving). The fast, de-embedding calibration method (FIG. 11) consists in measuring first the s-parameters of the slabline with both probes in STATE 2 (withdrawn) and save in a matrix [S0]; then set probe 1 in STATE 1 (inserted), measuring s-parameters Sij(X1) between the test and idle ports for the N positions of X1, save the data in a file S1, withdraw probe 1 and insert (STATE 1) probe 2, measure again s-parameters Sij(X2) at all M positions of X2 and save in a file S2. Subsequently the data in files S1 and S2 are retrieved and saved in rapid access memory RAM of the control computer; after that s-parameters $Sij(X_k)$ are compared concerning $X_k$, whereby k=1 or 2: if X1≤X2, then Sij(X2) is cascaded with $[S0]^{-1}$ and resaved in file S2; else Sij(X1) is cascaded with $[S0]^{-1}$ and resaved in file S1; subsequently all M*N permutations of the s-parameters in updated files S1 and S2 in RAM, are cascaded into a new set of M*N s-parameter sets Sij(X1,X2) which are the calibration data of the tuner at frequency F; presumably all-parameter matrix multiplications are executed after converting s-parameters to ABCD or transfer (T-parameters), see ref. 8, and back to s-parameters; the result of this operation lasts much less than before: a total of M+N points are measured and data are processed very fast in memory. The total time (assuming 2 seconds per point, as before) is: 200*2 sec+20 sec (processing time)=7 minutes, compared with 5.5 hours, a significant gain.

The tuner must be calibrated before using: as already mentioned there are two methods: the brute method and the smart method: the brute method consists in moving the inserted tuning probes to a number N, M (typical 100) positions, measure s-parameters of the tuner on a calibrated vector network analyzer (VNA) and save in a tuner calibration file in the format Sij(X1,X2) for each frequency F. This lengthy procedure moves probes and measures N×M i.e. typically, 100×100=10,000 times in the following steps:

a) connect the tuner to the VNA, pre-calibrated at a frequency F;

b) set both tuning probes in the state PS #2 (inserted);

c) in a measurement loop for a multitude N of positions X1, whereby 0≤X1≤λ(F)/2, c1) move tuning probe P #1 to position X1;

in a nested measurement loop for a multitude M of positions X2, whereby 0≤X2≤λ(F)/2, (i) move tuning probe P #2 to position X2;

(ii) measure s-parameters Sij, whereby {i,j}={1, 2};

(iii) save (X1, X2, Sij) in a file TUNER-CAL(F); change position X1 and return to step (c1);

d) when the measurement loop of X1 positions terminates, save the tuner calibration file at the frequency F: TUNER-CAL(F) for later use.

The smart calibration method uses alternative de-embedding of the tuner segments associated with the movement of either tuning probe and subsequent cascading concatenation of transmission formatted network parameters and comprises the following steps:

a) connect the tuner to the VNA, pre-calibrated at a frequency F;

b) set both tuning probes to the state PS #1 (withdrawn);

c) measure s-parameters and save in a zero matrix [S0];

d) in a measurement loop for a multitude M of positions X1 with $0 \leq X1 \leq \lambda(F)/2$:

d1) set the tuning probe P #1 to the state PS #2 (inserted);

d2) move the tuning probe P #1 to the multitude M of positions X1;

d3) measure s-parameters Sij, whereby {i,j}={1,2};

d4) save (X1, Sij) in a file S1;

e) set the tuning probe P #1 to the state PS #1 (withdrawn) and the tuning probe P #2 to the state PS #2 (inserted);

f) in a measurement loop for a multitude N of positions X2 with $0 \leq X2 \leq \lambda(F)/2$:

f1) move the tuning probe P #2 to position X2;

f2) measure s-parameters Sij whereby {i,j}={1,2};

f3) save (X2, Sij) in a file S2;

g) retrieve s-parameters Sij(X1) from the file S1 and Sij(X2) from the file S2;

h) in a scanning loop through Sij(X1) for the multitude M of positions X1:

execute a nested scanning loop through Sij(X2) for the multitude N of positions X2:

if (X1≤X2) then h1) cascade the invers s-parameter zero matrix $[S0]^{-1}$ with the s-parameters Sij(X2) of the file S2 and replace (update) in the file S2;

else if (X1>X2) then h2) cascade the invers s-parameter zero matrix $[S0]^{-1}$ with the s-parameters Sij(X1) of the file S1 and replace (update) in the file S1;

i) retrieve the s-parameters Sij(X1) from the updated file S1 and Sij(X2) from the updated file S2, cascade the s-parameters of the updated file S1 with the s-parameters of the updated file S2 to create Sij(X1,X2) and save (X1, X2, Sij(X1,X2)) in a file TUNER-CAL (F) for later use.

Figure 9:
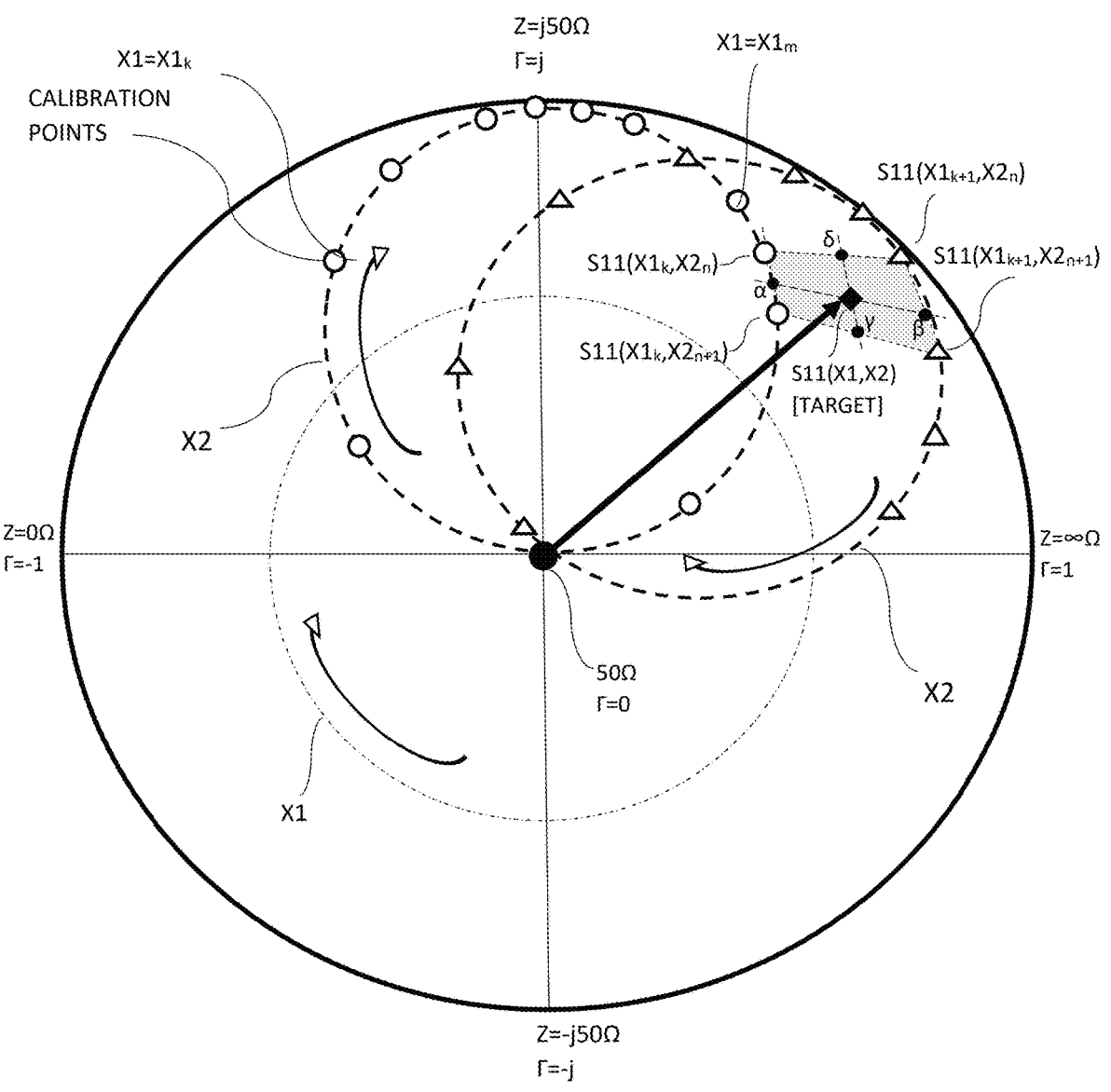
FIG. 9 depicts the tuning vector composition and interpolation strategy of the two-probe tuner with fixed probe insertion depth and shared slabline.

The interpolation routine uses calibration data, i.e. s-parameters Sij at the calibrated points probe positions $X1_n$ and $X2_k$ and allows accurate determination of the s-parameters Sij(X1,X2) of the tuner for any arbitrary probe settings (X1,X2) of the tuning probes, based on the four closest calibration points $(X1_k,X2_n)$, $(X1_{k+1},X2_n)$, $(X1_k,X2_{n+1})$, $(X1_{k+1},X2_{n+1})$, each pair selected on either the X1 or the X2 direction or trace of probe movement (FIG. 9); herein the probe positions are selected to be successive: $X1_k \leq X1 < X1_{k+1}$ (on the X1 trace) and $X2_n \leq X2 < X2_{n+1}$ (on the X2 trace), in order to create the shadowed polygon shown in FIG. 9, that includes the tunable point with target coordinates (X1,X2); once these points are determined, the interpolation executes in two steps: in step 1 linear interpolation allows determining s-parameters of four new interpolated points, marked in FIG. 9 as $\alpha$, $\beta$, $\gamma$, $\delta$: as follows:

$$Sij(\alpha)=Sij(X1_k,X2_n)+(X2-X2_n)/(X2_{n+1}-X2_n)\cdot(Sij(X1_k,X2_{n+1})-Sij(X1_k,X2_n)); \qquad \text{[eq. 1]}$$

$$Sij(\beta)=Sij(X1_{k+1},X2_n)+(X2-X2_n)/(X2_{n+1}-X2_n)\cdot(Sij(X1_{k+1},X2_{n+1})-Sij(X1_{k+1},X2_n)); \qquad \text{[eq. 2]}$$

$$Sij(\gamma)=Sij(X1_k,X2_{n+1})+(X1-X1_k)/(X1_{k+1}-X1_k)\cdot(Sij(X1_{k+1},X2_{n+1})-Sij(X1_k,X2_{n+1})); \qquad \text{[eq. 3]}$$

$$Sij(\delta)=Sij(X1_k,X2_n)+(X1-X1_k)/(X1_{k+1}-X1_k)\cdot(Sij(X1_{k+1},X2_n)-Sij(X1_k,X2_n)); \qquad \text{[eq. 4]}$$

In step 2 then, second order interpolated values Sij(X1,X2) are generated using these four new first order interpolated points Sij($\alpha$), Sij($\beta$), Sij($\gamma$) and Sij($\delta$) as follows:

$$Sij(X1,X2)=\{Sij(\alpha)+(X1-X1_k)/(X1_{k+1}-X1_k)\cdot(Sij(\beta)-Sij(\alpha))+Sij(\gamma)+(X2-X2_{n+1})/(X2_n-X2_{n+1})\cdot(Sij(\delta)-Sij(\gamma))\}/2 \qquad \text{[eq. 5]}.$$

Figure 12:
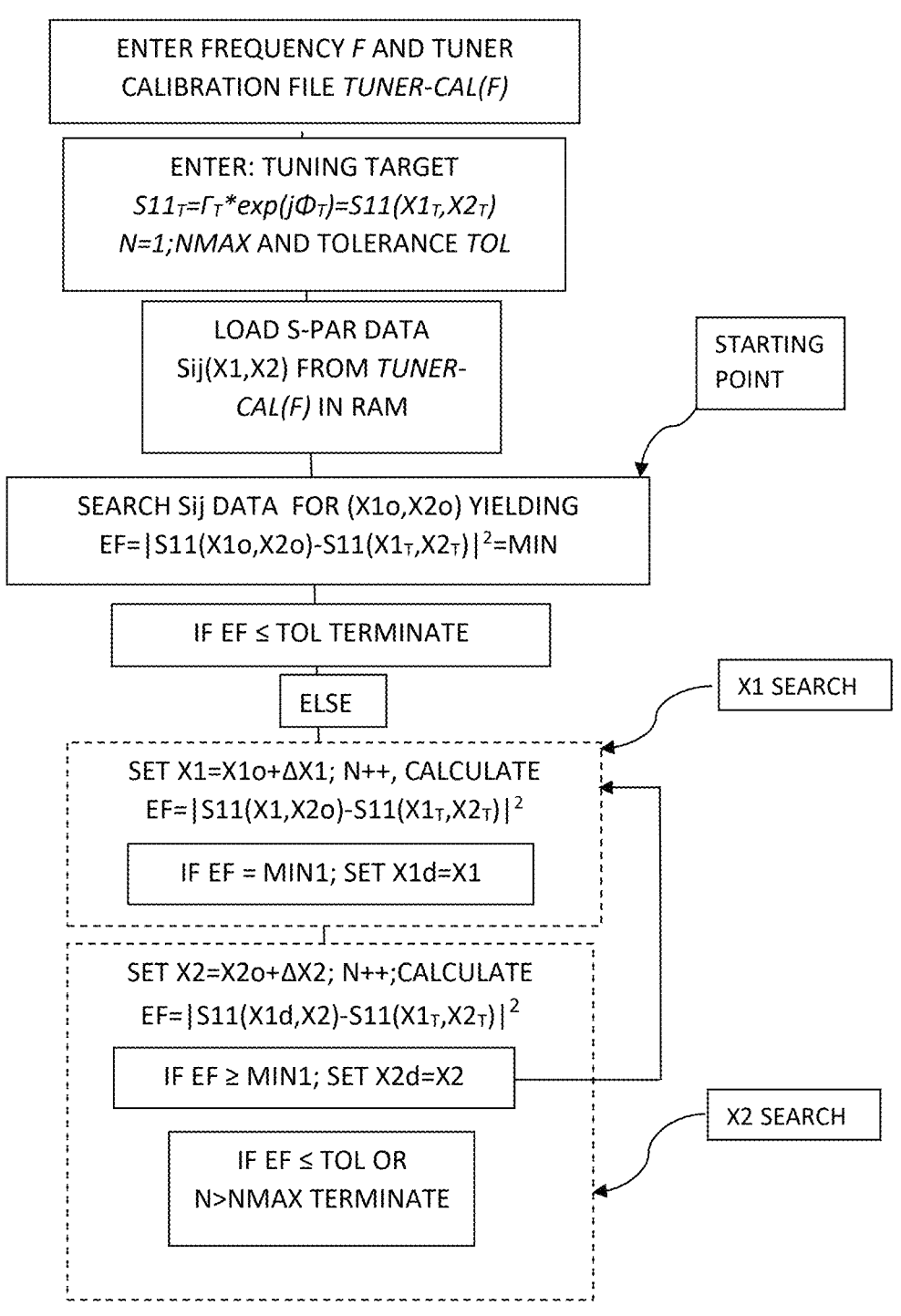
FIG. 12 depicts the flowchart of the impedance synthesis (tuning) process.

Once the tuner is calibrated and the s-parameter data Sij(X1,X2) data are saved in a calibration file TUNER-CAL (F) at a frequency F, they can be used to synthesize, either manually or in an automatic numeric search procedure, user-defined impedances or reflection factors at interpolated states between calibration points; the tuning process executes in a number of steps (FIG. 12): in a first step, after the frequency, the number of allowable search iterations NMAX and the tuning tolerance TOL (the allowable vector difference between the target and the tuned reflection factor) are defined, the process loads the tuner calibration file in random access (fast) RAM memory. The actual tuning process then, either automatically or manually triggered, imports one or more target reflection factors $\Gamma$ or impedances Z. The search starts by comparing the calibrated reflection factors S11(X1,X2) saved in the calibration data with each I and determining a set of starting values (X1o, X2o) for the subsequent search, for which the vector distance in form of an error function $EF=|S11(X1o,X2o)-\Gamma|^2$ is smallest (i.e., finding the smallest vector distance between the target I' and the closest calibrated point). If this value EF is already smaller than the prescribed tuning tolerance, the X1o,X2o values are saved as X1.final and X2.final and the search terminates. Else, starting with X1o,X2o, the process modifies X1 and X2 alternatively by small amounts $\delta$X1 and $\delta$X2, which are proportional (in a regula falsi kind of algorithm, see ref. 9) to the change of the error function EF, until a new local minimum of EF is reached. This means, if EF increases, then the $\delta$X1 or $\delta$X2 correction becomes negative and the X1 or X2 search reverses direction. After a first local minimum of EF is reached, the search changes direction, conserves the actual X1 and changes X2 as before; each time the EF function traverses a local minimum the search switches form X1 to X2 and back. After a number of iterations the vector (X1,X2) converges to final values X1.final or X2.final, either because EF is smaller that the tuning tolerance, or it is truncated, because the previously defined maximum number of iterations NMAX is exceeded. The search may end up in a local minimum with EF larger than the tuning tolerance, though in the case of only two variables a local minimum is improbable; any such difference would be related to the density of calibrated points or the size of the tuning tolerance (which cannot be zero, since the stepping motor control of the tuning probes dictates that the tuner, even with at very high positioning resolution, remains digital). To be able to execute this procedure, requires accurate interpolation routines, i.e., mathematical relations that allow calculating s-parameters Sij of the tuner at arbitrary probe positions (X1,X2) different than the calibrated positions (X1.c,X2.c) as described above. For best accuracy these relations must describe approximately enough the natural behavior of the tuner as described before, based on (FIG. 9).

Obvious alternative embodiments of a system using tuners with dual-state tuning probes, diametrically inserted into and sharing the same slabline of the slide screw impedance tuners and associated calibration and tuning methods shall not impede on the core idea of the present invention.

What is claimed is:

1. A load-pull tuner system comprising:
   a) an automated slide screw tuner with two dual-state tuning probes,
   b) tuner calibration methods,
   c) an impedance synthesis (tuning) method,
   wherein
   a) the automated slide screw tuner includes:
      a parallel plate airline (slabline) having an input port, an output port, a center conductor and two conductive sidewalls forming a channel, and
      two mobile carriages C #1 and C #2, mounted across the channel, opposite to each-other, one on top and one on bottom of the sidewalls, remotely movable along the slabline using a control computer, each said mobile carriage carrying a dual-state tuning probe, carriage C #1 carrying tuning probe P #1 and carriage C #2 carrying tuning probe P #2,
      wherein
      the dual-state tuning probes are insertable diametral into the channel and settable to two preset states PS #1 and PS #2, state PS #1 corresponding to full withdrawal of the tuning probe from the channel of the slabline and state PS #2 corresponding to insertion of the tuning probe into the channel of the slabline to a fixed distance from the center conductor;
   and wherein
      each tuning probe has an initial (zero) position X1.0 and X2.0 correspondingly,
      relative to the test port, and
      carriage C #1 moves tuning probe P #1 to a position X1 relative to the test port, and
      carriage C #2 moves tuning probe P #2 to a position X2 relative to the test port;
   and wherein
      if X1>X2 then tuning probe P #2 is closer to the test port than tuning probe P #1, else if
      X1≤X2 then tuning probe P #1 is equal or closer to the test port than tuning probe P #2;
   b) the tuner calibration methods comprise:
      b1) a first tuner calibration method comprising:
      routines for control of a pre-calibrated vector network analyzer (VNA),
      positioning the tuning probes to a multitude of distinct positions, measuring s-parameters by the VNA as a function of the multitude of tuning probe positions and acquiring s-parameter data by the control computer, processing the acquired s-parameter data numerically using swapped de-embedding and saving the processed s-parameter data in tuner calibration files in the control computer;
      b2) a second tuner calibration method comprising:
      routines for control of a pre-calibrated vector network analyzer (VNA),
      positioning the tuning probes to a multitude of distinct positions, measuring s-parameters by the VNA as a function of the multitude of tuning probe positions, and saving the processed s-parameter data in tuner calibration files in the control computer;
   c) the impedance synthesis (tuning) method comprises:
      retrieval of tuner calibration s-parameter data from the tuner calibration files, interpolation of s-parameter data between the distinct calibrated positions and numeric search among the calibrated and interpolated s-parameter data for the tuning probe positions that generate user defined impedances.

2. The load-pull tuner system of claim 1,
wherein
   the slabline of the slide screw tuner is at least one half of a wavelength long ($\lambda$/2) at a minimum operation frequency (Fmin).

3. The load-pull tuner system of claim 1,
wherein the first tuner calibration method, comprises swapped de-embedding with following steps:
   a) connect the tuner to the VNA, pre-calibrated at a frequency F;
   b) set both tuning probes to the state PS #1 (withdrawn);
   c) measure s-parameters and save in a zero matrix [S0] and set the tuning probe P #1 to the state PS #2 (inserted);
   d) in a measurement loop for a multitude M of positions X1 with X1.0≤X1≤X1.0+$\lambda$(F)/2:
      d1) move the tuning probe P #1 to a position X1;
      d2) measure s-parameters Sij, whereby {i,j}={1,2};
      d3) save the s-parameters and the associated probe P #1 position in a format (X1, Sij) in a file S1;
      d4) when all positions M have been selected:
   e) set the tuning probe P #1 to the state PS #1 (withdrawn) and the tuning probe P #2 to the state PS #2 (inserted);
   f) in a measurement loop for a multitude N of positions X2 with X2.0≤X2≤X2.0+$\lambda$(F)/2:
      f1) move the tuning probe P #2 to a position X2; f2) measure s-parameters Sij whereby {i,j}={1,2};
      f3) save the s-parameters and the associated probe P #2 position in a format (X2, Sij) in a file S2;
      f4) when all positions N have been selected:
   g) retrieve s-parameters Sij(X1) from the file S1 and Sij(X2) from the file S2;
   h) in a scanning loop through Sij(X1) for the multitude M of positions X1:
      execute a nested scanning loop through Sij(X2) for the multitude N of positions X2:
      if (X1≤X2) then
      h1) cascade the inverse s-parameter zero matrix $[S0]^{-1}$ with the s-parameters Sij(X2) of the file S2 and replace (update) in the file S2;
      else if (X1>X2) then
      h2) cascade the inverse s-parameter zero matrix $[S0]^{-1}$ with the s-parameters Sij(X1) of the file S1 and replace (update) in the file S1;
   i) retrieve the s-parameters Sij(X1) from the updated file S1 and Sij(X2) from the updated file S2, cascade the s-parameters of the updated file S1 with the s-parameters of the updated file S2 to create Sij(X1,X2) and save (X1, X2, Sij(X1,X2)) in a file TUNER-CAL(F) for later use.

4. The load pull tuner of claim 1, wherein the second tuner calibration method further comprises the following steps:
   a) connect the tuner to the VNA, pre-calibrated at a frequency F;
   b) set both tuning probes in the state PS #2 (inserted);

c) in a measurement loop for a multitude M>1 of positions X1, whereby $X1.0 \leq X1 \leq X1.0 + \lambda(F)/2$, c1) move tuning probe P #I to a position X1;

c2) in a nested measurement loop for a multitude N>1 of positions X2, whereby $X2.0 \leq X2 \leq X2.0 + \lambda(F)/2,$ (i) move tuning probe P #2 to a position X2;

(ii) measure s-parameters Sij, whereby $\{i,j\}=\{1,2\}$;

(iii) save (X1, X2, Sij) in a file TUNER-CAL(F);

when all X2 positions of the multitude of N positions have been selected, select a next position X1 and return to step (c1);

d) when all X1 positions of the multitude of M positions have been selected, save the file TUNER-CAL(F) for later use.

5. The load-pull tuner system of claim 4, wherein the impedance synthesis (tuning) method comprises:

a) define a frequency F and load the tuner calibration file TUNER-CAL(F) in memory;

b) define a tuning target reflection factor $\Gamma=|\Gamma|*\exp(j\Phi)$ and a maximum number of iterations NMAX;

c) search in s-parameter Sij(X1,X2) data of the file TUNER-CAL(F) for an initial calibration point S11 (X1o, X2o), for which an error function $EF=|S11(X1o, X2o)-\Gamma|^2$, defined as the vector difference between the test port reflection factor S11 at probe positions X1o and X2o and the target reflection factor $\Gamma$, is minimum;

d) set N=1 and search among interpolated s-parameter data S11(X1,X2) in the area surrounding the initial tuner setting (X1o,X2o) for a final tuner setting (X1.final,X2.final) in following steps:

d1) from the initial tuner setting (X1o,X2o) in a first optimization loop as follows: set N=N+1 and change X1o by $\delta X1$ to $X1o+\delta X1$, with $\delta X1$ proportional to the change of the Error Function $EF=|S11(X1o+\delta X1,X2o)-\Gamma|^2$, until the error function EF reaches a minimum, and set X1o'=X1o+$\delta$X1;

d2) from a new tuner setting (X1o',X2o) in a second optimization loop as follows: set N=N+1 and change X2o by $\delta X2$ to $X2o+\delta X2$, with $\delta X2$ proportional to the change of the Error Function $EF=|S11(X1o', X2o+\delta X2)-\Gamma|^2$, until the error function EF reaches a minimum, and set X2o'=X2o+$\delta$X2;

d3) set X1o=X1o', X2o=X2o' and repeat steps d1) and d2) until there is no further Error Function EF reduction, or if N>NMAX;

d4) define X1.final=X1o', X2.final=X2o';

e) insert the tuning probes to the state PS #2 and move the tuning probe P #1 to X1.final and the tuning probe P #2 to X2.final.

\* \* \* \* \*